United States Patent [19]
Priebe et al.

[11] Patent Number: 5,748,070
[45] Date of Patent: May 5, 1998

[54] HIGH SPEED METHOD AND APPARATUS FOR DETECTING ASSERTION OF MULTIPLE SIGNALS

[75] Inventors: Gordon W. Priebe, Champlin; Myron Buer, Eden Prairie, both of Minn.

[73] Assignee: LSI Logic Corporation, Milpitas, Calif.

[21] Appl. No.: 689,906

[22] Filed: Aug. 15, 1996

Related U.S. Application Data

[63] Continuation-in-part of Ser. No. 527,660, Sep. 13, 1995, Pat. No. 5,610,573.
[51] Int. Cl.⁶ .................................................. G06F 7/02
[52] U.S. Cl. .................................... 340/146.2; 327/53
[58] Field of Search ........................... 340/146.2; 327/53

[56] References Cited

U.S. PATENT DOCUMENTS

| | | | |
|---|---|---|---|
| 4,040,016 | 8/1977 | Lee et al. | 340/173 |
| 4,634,900 | 1/1987 | Koshizuka | 307/530 |
| 4,641,283 | 2/1987 | Wilhelm | 365/190 |
| 4,825,110 | 4/1989 | Yamaguchi et al. | 307/530 |
| 4,964,083 | 10/1990 | Nogle et al. | 365/189.11 |
| 4,991,141 | 2/1991 | Tran | 365/207 |
| 5,268,874 | 12/1993 | Yamauchi | 365/233.5 |
| 5,345,419 | 9/1994 | Fernstermaker et al. | 365/189.04 |
| 5,414,662 | 5/1995 | Foss et al. | 365/203 |
| 5,610,573 | 3/1997 | Priebe | 340/146.2 |

FOREIGN PATENT DOCUMENTS 1-248397  10/1989  Japan .

Primary Examiner—Margaret Rose Wambach
Attorney, Agent, or Firm—Westman, Champlin & Kelly, P.A.

[57] ABSTRACT

A multiple match detection circuit including an array of N and P-channel pull-up and pull-down devices receiving a corresponding array of hit line signals for developing complementary bit line signals, which are provided to the respective inputs of a differential comparator. Respective buffers drive the bit line signals to a maximum voltage differential in normal mode. For each hit line asserted, the pull-up and pull-down devices modify the voltage of the corresponding bit line voltage between the bit lines by an incremental amount, thereby decreasing the differential. Any single hit line does not cause enough of a voltage change to reverse the polarity of the differential voltage between the bit lines. However, if more than one hit line is asserted, the combined incremental change of voltage due to activation of two or more pull-up and pull-down devices is greater than the maximum voltage differential between the bit line signals asserted by the buffers, causing the bit line differential voltage to reverse polarity. The differential comparator detects the reversal of polarity of the bit line differential voltage and asserts an error signal. The multiple detection circuit further includes a transmission gate, which selectively equalizes charge on the bit lines, and isolation devices, which provide level shifting, prior to detection by the differential amplifier to thereby increase the speed of detection.

21 Claims, 3 Drawing Sheets

HIGH SPEED METHOD AND APPARATUS FOR DETECTING ASSERTION OF MULTIPLE SIGNALS

CROSS REFERENCE TO RELATED APPLICATION

This application is a Continuation-in-Part of U.S. application Ser. No. 08/527,660, filed Sep. 13, 1995, and entitled METHOD AND APPARATUS FOR DETECTING ASSERTION OF MULTIPLE SIGNALS, now U.S. Pat. No. 5,610,573.

BACKGROUND OF THE INVENTION

The present invention relates to multiple signal match detection, and more particularly to a method and apparatus for detecting two or more signals asserted at the same time for indicating an error condition.

It is desired to detect the assertion of two or more signals at the same time, such as two or more word or hit lines signals of a memory system. For example, a plurality of word or hit lines are typically used to access individual memory cells, where only one hit line should be asserted at any given time to assure that the correct data is read or written. If any error condition exists where two or more hit lines are asserted, it is desired to detect and report the error condition in order to invalidate data written or otherwise retrieved.

In a circuit according to prior art, a plurality of N-channel metal-oxide semiconductor field-effect transistors (MOSFETs) have their drains connected to a common node, where the common node is pulled high through a pull-up resistor. The sources of the MOSFETs are connected to ground and their gates receive respective hit lines signals. An inverter having its input connected to the common node asserts an error signal whenever the common node is pulled low. Normally, all of the hit lines are deasserted low, so that the common node is normally pulled high through the pull-up resistor. When any one hit line is asserted, the corresponding MOSFET is activated thereby providing a resistive current path to ground. This resistive current path divides the overall voltage with the pull-up resistor to reduce the voltage of the common node. However, a single N-channel MOSFET is not intended to be able to pull the voltage of the common node low enough to switch the inverter. If a second hit line is asserted activating another MOSFET, the combined parallel resistance of the two or more MOSFETs pulls the common node to a low enough voltage to switch the inverter, thereby asserting the error signal.

The prior art circuit described above is easily implemented, but is relatively unreliable over all voltage, temperature and process combinations. In particular, such voltage, temperature and process variations affect all components, including the pull-up resistor, the MOSFETs and the inverter, thereby changing the switch point of the circuit. The unreliability occurs because voltage, temperature, and/or process variations cause a large range for the switch point, rendering operation unpredictable over all operating conditions. In particular, such variations often cause the circuit to fail to detect multiple hit lines being asserted, or to be indicated an error condition with the assertion of only one hit line.

It is desired to provide a reliable, multiple match detection circuit which is reliable over variations of voltage, temperature and process variations. Such a circuit could be used to increase the reliability of memory devices, such as a translation look-aside buffer (TLB). Such error detection would simplify the development of an operating system and memory management hardware for very efficient and fast detection of erroneous data.

SUMMARY OF THE INVENTION

The multiple match detection circuit of the present invention monitors a plurality of hit line signals. The circuit includes a first buffer for asserting a first bit line signal to a first predetermined voltage level and a second buffer for asserting a second bit line signal to a second predetermined voltage level, which is less than the first predetermined voltage level. A plurality of pull-down devices are coupled to the first bit line signal, with each pull-down device receiving a corresponding one of the hit line signals for decreasing the voltage of the first bit line signal. A plurality of pull-up devices are coupled to the second bit line signal, with each pull-up device receiving a corresponding one of the hit line signals for increasing the voltage of the second bit line signal. A charge transmission device is coupled between the first and second bit line signals for selectively coupling charge between the first and second bit line signals. A differential comparator detecting a voltage differential between the first and second bit line signals and asserts an error signal indicative of the voltage differential. Temporarily coupling charge between the first and second bit line signals prior to detection by the differential comparator speeds resolution of the differential voltage across the bit line signals.

In a preferred embodiment of the present invention, the multiple match detection circuit further includes voltage isolation devices coupled in series between the pull-down and pull-up devices and the differential comparator. The voltage isolation devices level-shift the bit line voltages to the comparator and may be pulsed off to isolate the pull-down and pull-up devices from the first and second buffers when the charge transmission device couples charge between the first and second bit line signals. This further reduces the power consumed by the circuit.

DETAILED DESCRIPTION OF THE PREFERRED EMBODIMENTS

Figure 1:
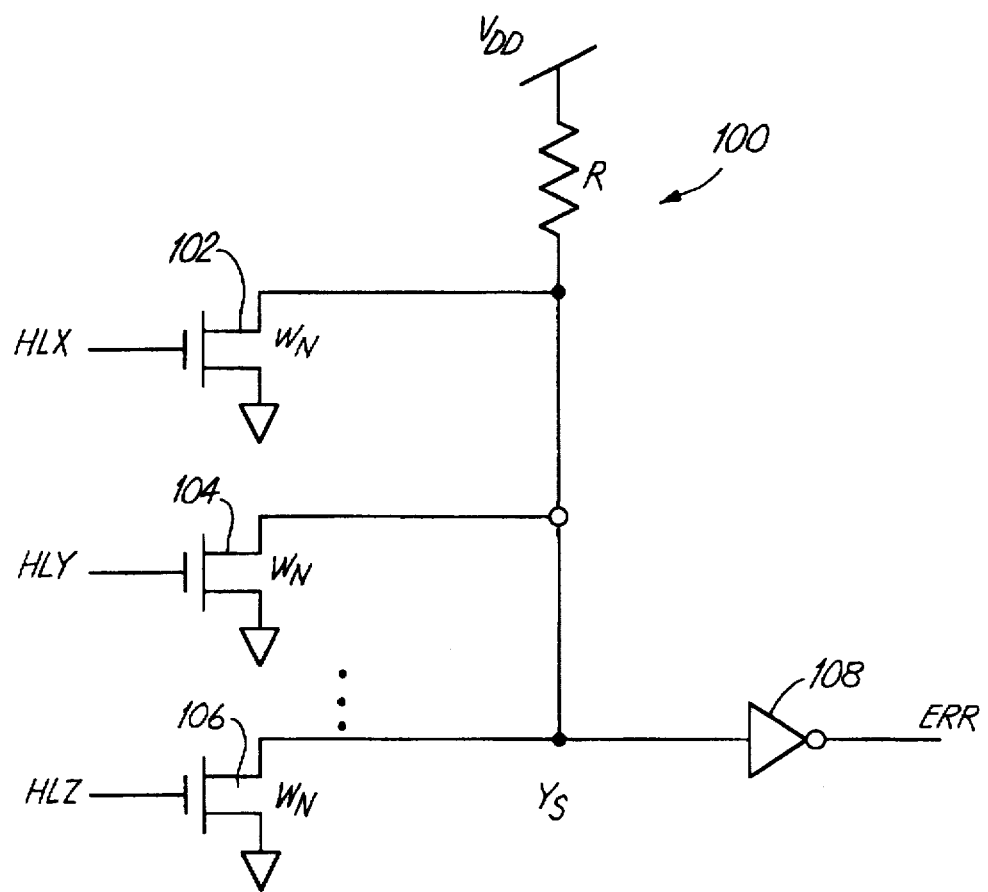
FIG. 1 is a simplified schematic diagram of a multiple match detection circuit according to prior art.

Referring now to FIG. 1, a simplified schematic diagram is shown in a multiple match detection circuit 100 according to the prior art. A plurality of hit lines signals $HLX$, $HLY$, . . . $HLZ$ are provided to the gate inputs of a corresponding plurality of N-channel metal-oxide semiconductor field-effect transistors (MOSFETs) 102, 104, . . . 106, each having their sources connected to ground and their drains connected together to a common node $Y_s$. The $Y_s$ node is also connected to one end of a pull-up resistor R. The other end of the resistor R is connected to power supply VDD. The $Y_s$ node is also connected to the input of an inverter 108, which asserts an error signal ERR at its output. Although only three hit line signals $HLX$, $HLY$ and $HLZ$ are illustrated for purposes of clarity, it is understood that the number of hit lines could be much larger, such as for example, 32, 64, 128, etc.

Operation of the multiple detection circuit 100 is now described. In a default condition, the HLX, HLY and HLZ hit line signals are all deasserted low, so that the corresponding MOSFETs 102, 104 and 106 are turned off. The $Y_s$ signal is pulled high through the pull-up resistor R to VDD so that the ERR signal is deasserted low. The assertion of any one of the hit line signals, such as the HLX signal, causes the corresponding MOSFET 102 to be activated. The path between the drain and source of each of the MOSFETs 102, 104 and 106 is high impedance path when deactivated and is a resistive path when activated, thereby dividing the VDD voltage between the resistor R and the drain to source resistance of the activated MOSFET.

It is intended that the resistance of each one of the MOSFETs 102, 104 and 106 is high enough and that the switch point of the inverter 108 is low enough, so that the $Y_s$ signal does not switch the inverter 108 when only one of the hit line signals is asserted high. In this manner, when any one of the hit line signals HLX, HLY or HLZ is asserted and the remaining hit line signals are deasserted, then the $Y_s$ signal is above the threshold of the inverter 108 so that it still asserts the ERR signal low. The effective resistance of the MOSFETs 102, 104 and 106 and the switch point of the inverter 108 are intended to be such that when any two or more of the MOSFETs 102, 104 and 106 are turned on, the $Y_s$ signal is pulled low enough to toggle the inverter 108, which correspondingly asserts the ERR signal high.

Although, the intended operation of the multiple match detection circuit 100 is to assert the ERR signal whenever two or more hit line signals are asserted, experience has shown that the multiple detection circuit 100 is unreliable over the total spectrum of operating parameter variations. For example, voltage variations of VDD will cause shifting of the voltage at the $Y_s$ node. Temperature changes also affect the values of the resistor R, and the switching point and effective resistances of the MOSFETs 102, 104 and 106. In addition, the operating characteristics, i.e., switching point of the inverter 10 could also be affected. Thus, the possible variations in the $Y_s$ signal and switching point of the inverter 108 may cause malfunction of the multiple match detection circuit 100. When there are multiple variations of two or more of these parameters, there may be a significant increase the probability of malfunction. Thus, proper operation cannot be guaranteed. Such process variations are likely to occur for the MOSFETs 102, 104 and 106, which are otherwise assumed to be substantially the same.

In summary, the multiple match detection circuit 100 shown in FIG. 1 is unreliable over all voltage, temperature and process ranges and combinations thereof. Combinations of variations in voltage, temperature and/or the manufacturing process often cause false tripping of the circuit even if only one hit line signal is asserted, or multiple match conditions may go undetected.

Figure 2:
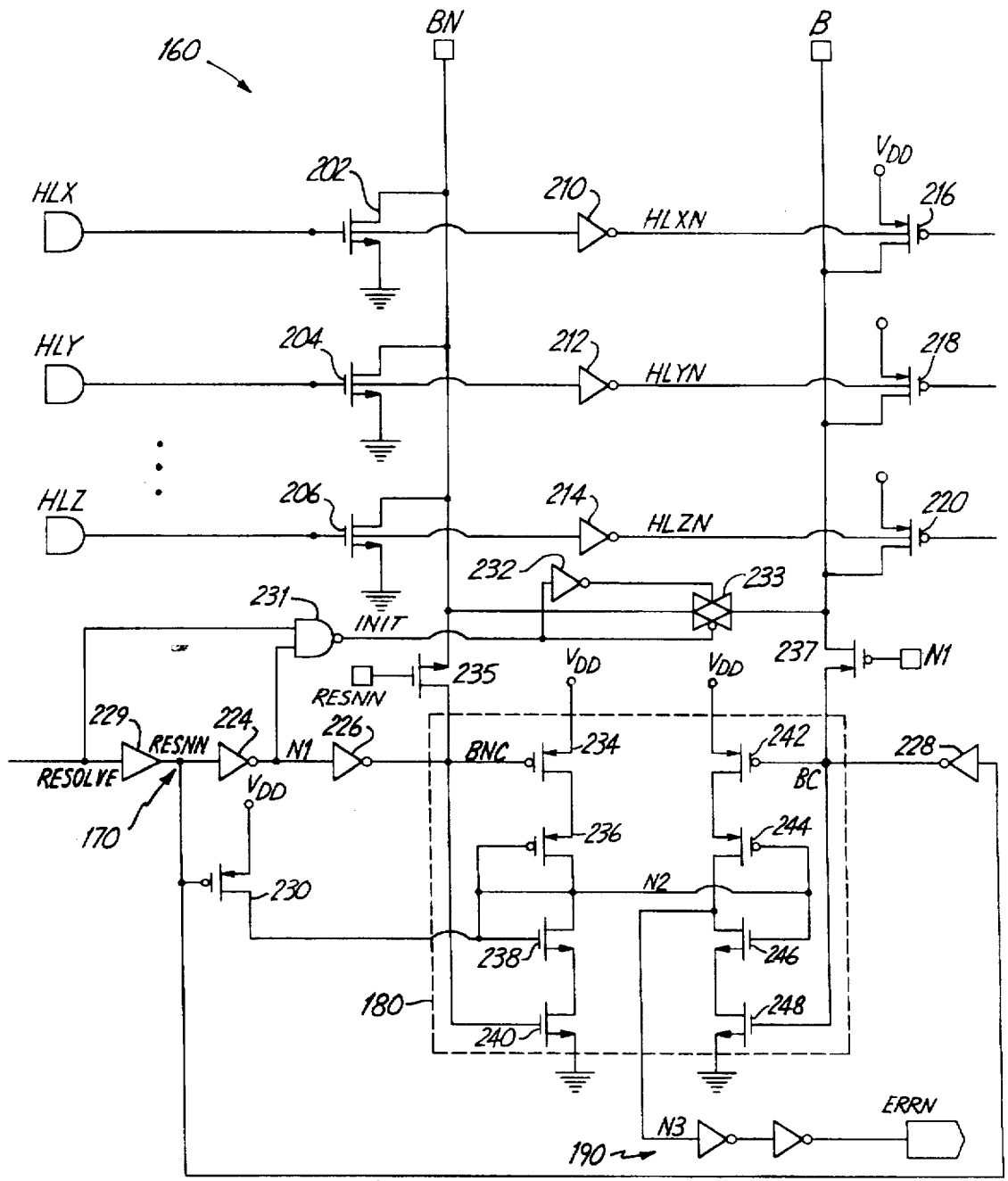
FIG. 2 is a schematic diagram of a multiple match detection circuit according to the present invention.

FIG. 2 is a schematic diagram of a multiple match detection circuit 150 implemented according to the present invention. Detection circuit 150 includes a voltage modification circuit 160, a resolve control circuit 170, a differential comparator 180 and an error output circuit 190. Voltage modification circuit 160 includes N-channel MOSFETs 202, 204 and 206, inverters 210, 212 and 214 and P-channel MOSFETs 216, 218 and 220. Resolve circuit 170 includes inverter buffers 224, 226 and 228, delay circuit 229, NAND logic gate 231, inverter 232, transmission gate 233, N-channel isolation MOSFET 235 and P-channel isolation MOSFET 237. A single, non-inverting buffer could replace the dual series inverters 224, 226. Differential comparator 180 includes P-channel MOSFET 230, N-channel MOSFETs 238, 240, 246 and 248 and P-channel MOSFETs 234, 236, 242 and 244. Finally, error output circuit includes inverters 250 and 252.

Three hit line signals HLX, HLY and HLZ are shown as inputs to multiple match detection circuit 150. However, any number of hit line signals, such as 32, 64, 128, etc., could be provided to the multiple match detection circuit 150. The HLX, HLY and HLZ signals are provided to the gates of N-channel MOSFET 202, 204 and 206, respectively, each having their sources connected to ground and their drains connected together to a common negative bit line signal BN. The hit line signals HLX, HLY and HLZ are also provided to the inputs of inverters 210, 212 and 214, respectively, having their outputs providing corresponding inverted hit lines signals HLXN, HLYN and HLZN. The inverted hit lines signals HLXN, HLYN and HLZN are provided to the gates of P-channel MOSFETs 216, 218 and 220, respectively. The P-channel MOSFETs 216, 218 and 220 have their drains connected together and to a positive bit line signal B. The sources of the MOSFETs 216, 218 and 220 are all pulled high to supply voltage VDD. Bit line signals B and BN together serve as differential voltage modifiers which are incremented as a function of the number of hit line signals HLX, HLY and HLZ that are simultaneously asserted, as discussed below.

A timing signal, RESOLVE, is applied to the input of delay circuit 229 and to an input of NAND gate 231. In one embodiment, delay circuit 229 includes four inverters coupled together in series. However, delay circuit 229 can include any type and number of delay circuit elements. Delay circuit 229 has an output RESNN which is coupled to the inputs of inverter buffers 224 and 228 and to the gate of MOSFET 230. The output of buffer 224 is coupled to node N1, which is coupled to the other input of NAND gate 231 and to the input of inverter buffer 226. The output of NAND gate 231 is coupled to an active low enable input of transmission gate 233. The output of NAND gate 231 is also coupled to an active high enable input of transmission gate 233 through inverter 232. Delay circuit 229, inverter 224 and NAND gate 231 form a pulse generator which generates an active low enable pulse INIT for enabling transmission on gate 233 in response to a low-to-high transition in the RESOLVE signal. The width of the enable pulse is determined by the delay through delay circuit 229 and inverter 224. When enabled, transmission gate 233 is electrically conducting and effectively "shorts" bit line signals B and BN together. When shorted, the charge on the bit line signals B and BN tends to equalize as the voltages on the bit lines approach VDD/2. When disabled, transmission gate 233 is non-conducting.

N-channel isolation MOSFET 235 is coupled between bit line signal EN and bit line signal BNC. Bit line signal BNC provides a negative comparison input to differential comparator 180. P-channel isolation MOSFET 237 is coupled between bit line signal B and bit line signal BC. Bit line signal BC provides a positive comparison input to differential comparator 180. The gates of N-channel and P-channel isolation MOSFETs 235 and 237 are coupled to nodes RESNN and N1, respectively. In a default state, the RESOLVE signal is deasserted low and N-channel and P-channel MOSFETs 235 and 237 are off to isolate bit line signals BC and BNC from bit line signals B and BN, respectively. When the RESOLVE signal goes high, and after the delay through delay circuit 229, N-channel and P-channel isolation transistors 235 and 237 turn on and couple bit line signal B to bit line signal BC and bit line signal BN to bit line signal BNC.

In an alternative embodiment, the gates of N-channel and P-channel isolation MOSFETs 235 and 237 are tied high and low, respectively, and not gated by the resolve signal RESOLVE. N-channel and P-channel isolation MOSFETs 235 and 237 therefore remain in an on state. In another alternative embodiment, transmission gate 233 is coupled between the drains of N-channel and P-channel MOSFETs 235 and 237, as opposed to their sources.

Bit line signals BC and BNC are driven by inverter buffers 228 and 226, respectively, in response to the RESOLVE signal. In the default state, the RESOLVE signal is deasserted low, which drives the BC and BNC signals high and low, respectively. When the RESOLVE signal is asserted high, the BC and BNC signals are driven to low and high states, respectively, assuming none of the MOSFETs 202, 204, 206, etc. and 216, 218, 220, etc. are activated. The inverters 226 and 228 assert the BC and BNC signals between a maximum voltage range, which is substantially between 0 and 3.3 volts in the embodiment shown.

The RESOLVE signal also drives differential comparator 180, through the gate of P-channel MOSFET 230. MOSFET 230 has its source coupled to VDD and its drain coupled to the gates of P-channel MOSFETs 236, 244 and N-channel MOSFETs 238, 246. The drains of the MOSFETs 236, 238 are connected together and to node N2. The drains of the MOSFETs 244, 246 are connected together for asserting an output signal on node N3 for error output circuit 190. The BNC signal is provided to the gate of P-channel MOSFET 234 and to the gate of N-channel MOSFET 240. The source of the P-channel MOSFET 234 is connected to VDD and its drain is connected to the source of the MOSFET 236. The source of the N-channel MOSFET 238 is connected to the drain of the MOSFET 240, which has its source connected to the ground. The BC signal is provided to the gate of P-channel MOSFET 242 and to the gate of N-channel MOSFET 248. The source of the P-channel MOSFET 242 is connected to VDD and its drain is connected to the source of P-channel MOSFET 24. The source of N-channel MOSFET 246 is connected to the drain of the N-channel MOSFET 248, which has its source connected to ground. Node N3 is coupled to inverter 250 which is connected in series with inverter 252. Error output circuit 190 asserts an error signal ERRN at the output of inverter 252.

The bit line signals B, BN, BC and BNC together form a complementary bit line scheme. When the RESOLVE signal is asserted high, the inverters 226, 228 normally drive the BNC, BC signals to the maximum voltage differential of approximately 3.3 volts as mentioned above. Each of the P-channel MOSFETs 216, 218, 220 act as pull-up devices when asserted for pulling the voltage of the B signal and thus the BC signal higher by an incremental amount to counteract the output of the inverter 228. In a similar manner, each of the N-channel MOSFETs 202, 204, 206 act as pull-down devices when asserted for pulling the voltage of the BN signal and thus the BNC signal low by an incremental amount to counteract the output of the inverter 226. These incremental changes reduced the differential voltage between the BC and BNC signals. The incremental voltage added by the complementary N and P-channel MOSFETs need not necessarily be the same. However, the combined incremental voltage added to the respective bit line signals B and BN by each pairing of corresponding P and N-channel devices activated alone is less than the maximum voltage differential of the bit line signals BC and BNC. Further, the combined incremental voltage added to the respective bit line signals B and BN by any two or more pairs of corresponding P and N-channel devices, activated together, is greater than the maximum voltage differential of the bit line signals BC and BNC.

The differential comparator 180 asserts the output signal on node N3 high or low based on the voltage differential of the BC and BNC signals when the MOSFET 230 is turned off. In general, the differential comparator 180 drives node N3, and thus the ERRN signal, high when the voltage difference between the BC and BNC signals (BC-BNC). The differential comparator 180 drives the ERRN signal low, indicating an error condition, when the voltage difference BC-BNC is positive. The differential comparator 180 need not be very sensitive to a differential voltage since the inverters 226, 228, the MOSFETs 202, 204, 206 and the MOSFETs 216, 218, 220 assure relatively wide voltage differentials between the BC and BNC signals. However, the differential comparator 180 should be implemented to have a fairly wide common mode range since the voltage differential between BC and BNC signals may be as high as 3.3 volts or as low as 400 mV in the embodiment shown. The particular differential comparator 180 shown is exemplary only, as any comparable differential comparator with adequate voltage sensitivity and relatively wide common mode range will suffice When the HLX, HLY, HLZ hit line signals are deasserted low, the N-channel MOSFETs 202, 204 and 206 and the P-channel MOSFETs 216, 218 and 220 are all turned off and otherwise do not affect the bit line signals B and BN. If the RESOLVE signal is deasserted low, the BC signal is asserted high and the BNC signal is asserted low. The P-channel MOSFET 230 is turned on pulling the node N2 high, which turns on the N-channel MOSFET 246. The BC signal activates the N-channel MOSFET 248, so that node N3 and the ERRN signal are asserted low. This is not considered an error condition, however, since the RESOLVE signal is deasserted low.

When the RESOLVE signal transitions from low to high, isolation MOSFETs 235 and 237 are initially off and NAND gate 231 generates enable pulse INIT which temporarily enables transmission gate 233. Transmission gate 233 attempts to equalizes the charge on bit line signals B and BN. Isolation MOSFETs 235 and 237 level-shift the bit line voltages to the comparator and, when disabled, isolate the pull up and pull down devices from comparator 180. Isolating bit line signals B and BN from bit line signals BC and BNC during equalization significantly decreases the power requirements of the multiple match detection circuit 150. After the initial delay period, determined by delay circuit 229 and inverter 224, node N1 goes low, which disables transmission gate 233. MOSFETs 235 and 237 turn on and apply bit line signals B and BN to bit line signals BC and BNC to thereby modify the voltage differential between BC and BNC as a function of HLX, HLY and HLZ. With the RESOLVE signal high, inverter 226 pulls bit line signal BNC high toward a predetermined maximum voltage level, such as 3.3 volts. Inverter 228 pulls bit line signal BC low toward a minimum voltage level, such as zero volts. Assuming the HLX, HLY, HLZ hit line signals are deasserted, node N2 temporarily stays high keeping the N-channel MOSFET 238 on even though the P-channel MOSFET 230 is turned off. When the BNC signal goes high, it activates the N-channel MOSFET 240 pulling node N2 low. Since the BC signal and node N2 are both low, the P-channel MOSFETs 242, 244 are turned on pulling node N3 and the ERRN signal high. In this case, when none of the HLX, HLY, HLZ hit line signals are asserted, the BNC signal turns the P-channel MOSFET 234 fully off and the N-channel MOSFET 240 fully on, while the BC signal turns the P-channel MOSFET 242 fully on and the N-channel MOSFET 248 fully off.

If only one of the HLX, HLY, HLZ hit line signals is asserted while the remaining hit line signals are deasserted when the RESOLVE signal is asserted, the asserted hit line signal activates a corresponding pull-down N-channel MOSFET at the output of the inverter 226 (the BNC signal) and a corresponding pull-up P-channel MOSFET at the output of the inverter 228 (the BC signal). The BNC signal is correspondingly not pulled all the way high and the BC signal is not pulled all the way low, which affects the states of the MOSFETs within the differential comparator 180. Nonetheless, the combined voltage increments of the BC and BNC signals caused by the one pull-up and one pull-down device is less than the aforementioned maximum voltage differential of the BC and BNC signals, so that the BNC signal remains at a higher voltage than the BC signal. The differential comparator 180 correspondingly deasserts node N3 and the ERRN signal high indicating no error has occurred.

If two or more of the HLX, HLY, HLZ hit line signals are asserted when the RESOLVE signal is asserted, two or more corresponding pull-down N-channel MOSFETs at the output of the inverter 226 (the BNC signal) and corresponding pull-up P-channel MOSFETs at the output of the inverter 228 (the BC signal) are asserted. Thus, two or more voltage increments counteract the inverters 226 and 228 and thus the BNC and BC signals. The combined voltage increments of the BC and BNC signals caused by two or more pull-up and pull-down devices are greater than the aforementioned maximum voltage differential between the BC and BNC signals, so that the BC signal is at a higher voltage than the BNC signal. The differential comparator 180 detects a reversal in the polarity between the BC and BNC signals and correspondingly asserts the ERRN signal low indicating an error has occurred.

Figure 3:
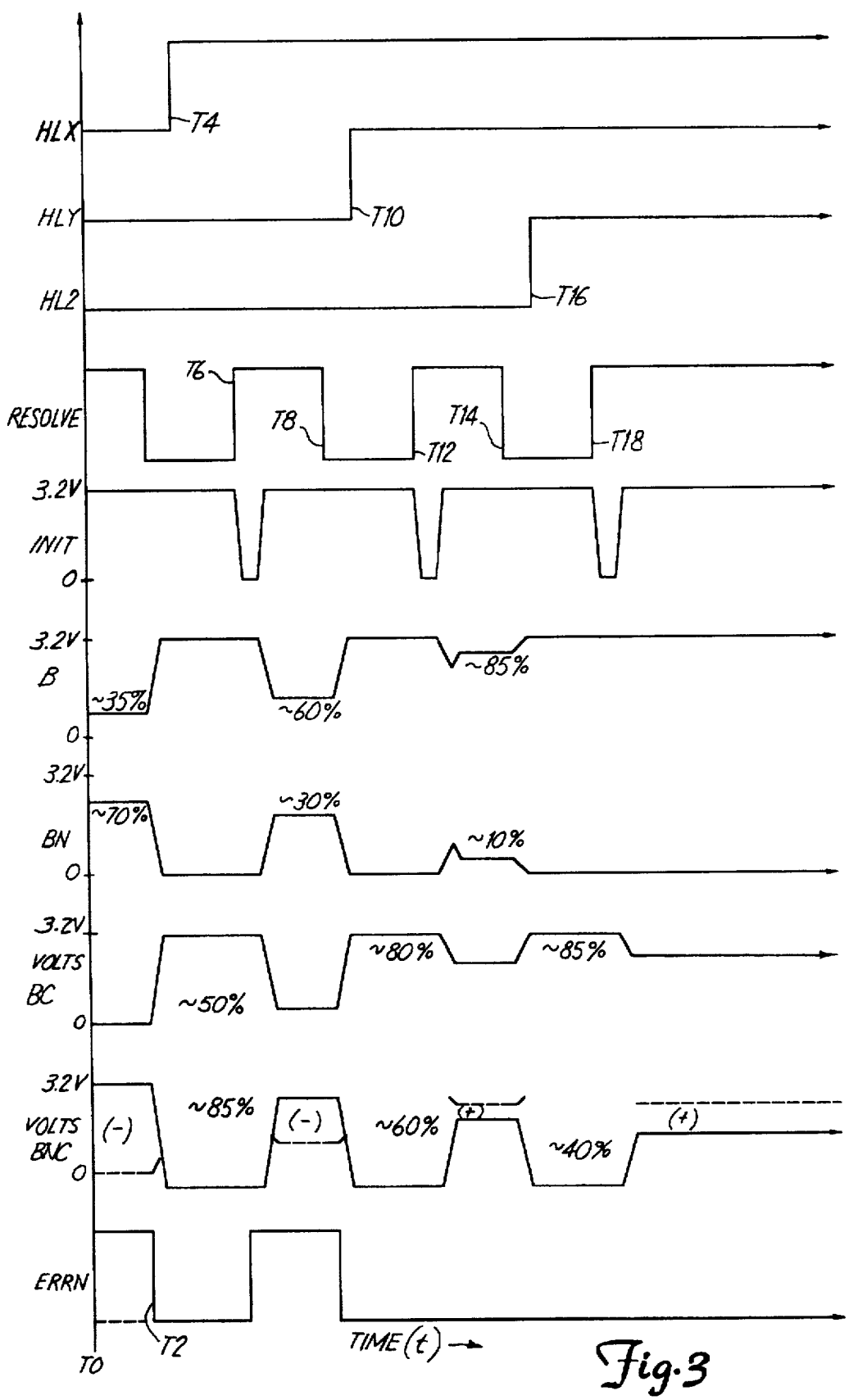
FIG. 3 is a timing diagram illustrating operation of the multiple match detection circuit of FIG. 2.

Operation of the multiple match detection circuit 150 is now described with reference to a timing diagram shown in FIG. 3. The HLX, HLY and HLZ hit line signals, the RESOLVE signal, the bit line signals B and BN, the transmission gate enable signal INIT, the bit line signals BC and BNC and the ERRN signal are plotted along the Y axis versus time along the X axis in FIG. 3. The BC signal is also superimposed on the BNC signal as a dashed line, indicating the differential between the BC and BNC signals.

At a time T0, the HLX, HLY and HLZ hit line signals are all deasserted low, while the RESOLVE signal is asserted high. Since none of the N-channel MOSFETs 202, 204 and 206 and none of the P-channel MOSFETs 216, 218, 220 are turned on, the inverters 228 and 226 drive the BC and BNC signals to ground and to approximately 3.3V, respectfully, at time T0. The differential comparator 180 thus asserts the ERRN signal high indicating a normal, non-error condition. At a time T2, the RESOLVE signal is low, causing the BC signal to be asserted fully high and the BNC signal to be asserted fully low, where the ERRN signal is correspondingly asserted low. However, this is a non-error condition, since the ERRN signal is evaluated only when the RESOLVE signal is asserted high.

Subsequently at a time T4, the HLX hit line signal is asserted high, thereby activating the pull-down N-channel MOSFET 202 and the pull-up P-channel MOSFET 216. The RESOLVE signal is then asserted high at a time T6. The INIT signal is pulsed low in response to the low to high transition of the RESOLVE signal. Transmission gate 233 begins conducting, which shorts the bit line signal B and the bit line signal BN together, forcing B and BN toward VDD/2 (or 1.6 volts). The duration of the INIT pulse determines how far B and BN charge or discharge toward VDD/2 before transmission gate 233 is disabled.

Near the end of the INIT pulse, isolation MOSFETs 235 and 237 turn on which couples bit line signals B and BN to bit lines BC and BNC, respectively. With only one hit line HLX asserted, bit line signal B discharges to about 60% of its maximum value while bit line signal BN charges to about 30% of its maximum value. Buffers 226 and 228 apply maximum and minimum voltages to BNC and BC which are counteracted by the incremental voltages applied by the bit line signals B and BN. The BNC signal charges only to approximately 85% full voltage and the BC signal discharges only to approximately half its full voltage. The combined voltage differential is about 65% of the maximum differential of the BC and BNC signals. Since the voltage of the BC signal is less than the voltage of the BNC signal, the differential comparator 180 drives the ERRN signal high, indicating a non-error condition. The RESOLVE signal is subsequently deasserted at time T8.

The HLY hit signal is asserted high at time T10 and the RESOLVE signal is correspondingly asserted high at time T12. The INIT signal again pulses low, causing the bit line signals B and BN to begin equalizing charge. Near the end of the INIT pulse, the bit line signals B and EN are again coupled to the bit line signals BC and BNC as buffers 226 and 228 apply a maximum voltage differential across the bit line signals BC and BNC. The bit line signal BC drops approximately to 80% of its maximum value and the bit line signal BNC rises approximately to 60–65% of its maximum value for a combined voltage increment of 120% of the maximum voltage differential across the bit line signals BC and BNC. This causes a positive differential between the bit line signals B and BNC while the RESOLVE signal is asserted, so that the differential comparator 180 asserts (or keeps asserting) the ERRN signal low indicating an error condition. This is a correct operation since two of the hit line signals, HLX and HLY are asserted, indicating an error.

The RESOLVE signal is deasserted at time T14 and the HLZ signal is asserted at time T16 so that the HLX, HLY and HLZ hit line signals are all asserted at time T16. The RESOLVE signal is subsequently asserted at time T18, where the bit line signal BC only drops to approximately 85% of its full value and the bit line signal BNC only rises to approximately 40% of its maximum value after the INIT pulse has terminated. Again, the voltage differential between the BC and BNC signals is positive so that the differential comparator 180 continues to assert the ERRN signal, indicating an error condition. This is correct operation since more than one of the hit line signals are asserted high while RESOLVE is asserted high.

It is noted that a worst case condition occurs between times T12 and T14, where a positive differential approximately 400 mV develops between the BC and BNC signals. A 400 mV differential is a significant amount of voltage and is easily detected by a standard differential comparator, such as the differential comparator 180 (FIG. 2). Thus, the differential comparator 180 need only detect relatively large voltage differentials (approximately 400 mV or greater) between the BC, BNC signals for correct operation.

The multiple match detection circuit 200 is very efficient and is relatively independent of variations in temperature, voltage and the manufacturing process. Due to the use of complementary bit lines and a differential comparator, such variations in voltage, temperature and process have less affect on the desired operation. Essentially, voltage and temperature variations are canceled out between complementary devices so that the resulting effect is somewhat independent of such variations. Even Manufacturing process variations are minimized using complementary devices, resulting in the correct operation over the spectrum of operating parameter variations.

Another advantage of the present invention is that it does not rely on a change in digital state before making a decision, which would be too slow if a plurality of hit line signals are being monitored. The greater the number of hit lines, the greater the amount of capacitance associated with the MOSFET devices, which would otherwise cause a significant increase in the time for switching a digital signal. In a multiple match detection circuit according to the present invention, a differential comparator measures a differential between two voltage signals rather than waiting for a digital change of state to occur. This provides a very fast switching mechanism relatively independent of the number of hit lines being monitored.

With a large number of hit lines, temporarily equalizing the charge on the bit lines significantly speeds the resolution of the bit lines without requiring large driving transistors and their associated increase in power consumption. In one embodiment, the delay between the RESOLVE signal and the ERRN signal decreased from 4.0 ns to 1.8 ns when the bit line signals B and BN were temporarily equalized during resolution. Isolating the BC and BNC signals from the B and BN signals during equalization dramatically reduces power consumption. As a result, the present invention allows for a large number (greater than 128) of parallel hit lines to be searched in parallel for multiple logic high states at a very high speed and with very low power consumption.

Although the present invention has been described with reference to preferred embodiments, workers skilled in the art will recognize that changes may be made in form and detail without departing from the spirit and scope of the invention. For example, the present invention can be implemented with various technologies other than CMOS and with various circuit configurations. Also, the voltage supply terminals can be relatively positive or relatively negative, depending upon the particular convention adopted and the technology used. The terms "pull-up" and "pull-down" used in the specification and the claims are arbitrary terms and can refer to either a logic high level or a logic low level depending upon the relative levels of the voltage supply terminals. Likewise, the terms "coupled" and "connected" can include various types of couplings or connections and can include a direct connection or a connection through one or more intermediate components.

What is claimed is:

1. A detection system for detecting at least two of a plurality of input signals being asserted simultaneously, comprising:

first and second buffers for asserting a maximum voltage differential between two bit line signals;

a charge coupling device coupled between the two bit line signals and having a conducting state and a nonconducting state, the charge coupling device temporarily coupling charge between the two bit line signals when in the conducting state;

an array of voltage modifying devices, each receiving a corresponding one of the input signals for decreasing the voltage differential between the bit line signals when a corresponding input signal is asserted, the array of voltage modifying devices reversing the polarity of the voltage differential when at least two of the input signals are asserted; and a differential comparator coupled to the bit line signals for detecting the voltage differential between the bit line signals and for asserting an error signal if the polarity is reversed.

2. The detection system of claim 1 wherein the array of voltage modifying devices comprises an array of N-channel devices and a corresponding array of P-channel devices for counteracting the first and second buffers, respectively.

3. The detection system of claim 2 and further comprising:

a buffer receiving a timing signal for asserting a first of the two bit line signals high;

an inverter receiving the timing signal for asserting a second of the two bit line signal low;

wherein the array of N-channel devices are coupled to the first bit line signals; and wherein the array of P-channel devices are coupled to the second bit line signal.

4. The detection system of claim 1 and further comprising a first isolation transistor coupled between one of the two bit line signals and the differential comparator and a second isolation transistor coupled between the other of the two bit line signals and the differential comparator.

5. The detection system of claim 4 wherein the first and second isolation transistors are coupled between the charge coupling device and the differential comparator.

6. The detection system of claim 4 wherein the first and second isolation transistors are coupled between the array of voltage modifying devices and the charge coupling device.

7. A multiple match detection circuit for monitoring a plurality of hit line signals, comprising:

a first buffer for asserting a first bit line signal to a first predetermined voltage level;

a second buffer for asserting a second bit line signal to a second predetermined voltage level which is less than the first predetermined voltage level;

a plurality of pull-down devices, each receiving a corresponding one of the hit line signals for decreasing the voltage of the first bit line signal;

a plurality of pull-up devices, each receiving a corresponding one of the hit line signals for increasing the voltage of the second bit line signal;

a charge transmission device coupled between the first and second bit line signals for selectively coupling charge between the first and second bit line signals; and a differential comparator for detecting a voltage differential between the first and second bit line signals and for asserting an error signal indicative of the voltage differential.

8. The multiple match detection system of claim 7 and further comprising:

a first isolation device coupled between the plurality of pull-down devices and the first buffer; and a second isolation device coupled between the plurality of pull-up devices and the second buffer.

9. The multiple match detection system of claim 8 wherein:

the first isolation device comprises a first isolation transistor coupled between the charge transmission device and the first buffer; and the second isolation device comprises a second isolation transistor coupled between the charge transmission device and the second buffer.

10. The multiple match detection system of claim 8 wherein:

the first isolation device comprises a first isolation transistor coupled between the plurality of pull-down devices and the charge transmission device; and the second isolation device comprises a second isolation transistor coupled between the plurality of pull-up devices and the charge transmission device.

11. The multiple match detection circuit of claim 7 wherein the first buffer comprises two series inverter buffers and wherein the second buffer comprises an inverter buffer.

12. The multiple match detection circuit of claim 7 wherein the first and second buffers receive a timing signal for asserting the first and second bit line signals, respectively.

13. The multiple match detection system of claim 12 and further comprising a pulse generator which receives a timing signal and is coupled to the charge transmission device, the pulse generator enabling the charge transmission device in response to the timing signal.

14. The multiple match detection system of claim 7 and further comprising:

a timing signal input;

a delay element coupled to the timing signal input and having a delay output coupled to the first and second buffers, the first buffer comprising first and second inverters coupled in series and the second buffer comprising an inverting buffer;

an N-channel isolation transistor coupled between the plurality of pull-down devices and the first buffer and having its gate coupled to the delay output, the N-channel isolation transistor selectively isolating the charge transmission device from the first buffer in response to the timing signal;

a P-channel isolation transistor coupled between the plurality of pull-up devices and the second buffer and having its gate coupled to the first inverter, the P-channel isolation transistor selectively isolating the charge transmission device from the second buffer in response to the timing signal; and a NAND gate having a first input coupled to the timing signal input, a second input coupled to the first inverter and an enable output coupled to the charge transmission device.

15. The multiple match detection circuit of claim 7 wherein the plurality of pull-down devices comprises an array of N-channel MOSFETs, each receiving a corresponding hit line signal at its gate and having its drain and source coupled between the first bit line signal and ground.

16. The multiple match detection circuit of claim 7 wherein the plurality of pull-up devices comprises:

an array of inverters, each receiving a corresponding hit line signal and asserting an inverted hit line signal; and an array of P-channel MOSFETs, each receiving a corresponding inverted hit line signal at its gate and having its drain and source coupled between a supply voltage and the second bit line signal.

17. The multiple match detection circuit of claim 7 wherein the differential comparator comprises:

a first P-channel MOSFET having its source coupled to a source voltage and its gate receiving the first bit line signal;

second P-channel MOSFET having its source coupled to the drain of the first P-channel MOSFET and its gate and drain coupled to an intermediate node;

a first N-channel MOSFET having its drain and gate coupled to the intermediate node;

a second N-channel MOSFET having its drain coupled to the source of the first N-channel MOSFET and its gate receiving the first bit line signal;

a third P-channel MOSFET having its source coupled to the source voltage and its gate receiving the second bit line signal;

a fourth P-channel MOSFET having its source coupled to the drain of the third P-channel MOSFET, its gate coupled to the intermediate node and its drain coupled to an output node;

a third N-channel MOSFET having its drain coupled to the output node and its gate coupled to the intermediate node;

a fourth N-channel MOSFET having its drain coupled to the source of the third N-channel MOSFET, its gate receiving the second bit line signal and its source coupled to ground; and a fifth P-channel MOSFET receiving a timing signal at its gate and having its source coupled to the source voltage and its drain coupled to the intermediate node.

18. The multiple match detection circuit of claim 17 and further comprising:

two series inverters having an input coupled to the output node of the differential comparator and an output for asserting the error signal.

19. The multiple match detection circuit of claim 7 wherein the difference between the first and second predetermined voltage levels defines a maximum voltage differential between the first and second bit line signals, wherein the combined voltage change of the first and second bit line signals caused by any one of the hit line signals being asserted is less than the maximum voltage differential, and wherein the combined voltage change of the first and second bit line signals caused by at least two of the hit line signals being asserted is greater than the maximum voltage differential.

20. A method of detecting at least two of a plurality of input signals asserted simultaneously, comprising:

applying a voltage differential across first and second bit lines;

temporarily coupling the first and second bit lines together;

decreasing the voltage differential across the first and second bit lines for each of the plurality of input signals asserted, wherein the polarity of the voltage differential reverses if at least two input signals are asserted;

monitoring the voltage differential; and indicating an error if the polarity of the voltage differential is reversed.

21. The method of claim 20 wherein:

the step of applying comprises applying a maximum voltage level to a first node on the first bit line and a minimum voltage level to a second node on the second bit line;

the step of decreasing comprises applying a pull-down voltage level to a third node on the first bit line and a pull-up voltage level to a fourth node on the second bit line;

the step of temporarily coupling comprises temporarily coupling the third and fourth nodes together; and wherein the method further comprises isolating the first and second nodes from the third and fourth nodes, respectively, during the step of temporarily coupling of the third and fourth nodes together.

* * * * *